(12) United States Patent
Esman et al.

(10) Patent No.: US 11,294,111 B1
(45) Date of Patent: Apr. 5, 2022

(54) CROSS-POLARIZATION SINGLE SIDEBAND OPTICAL MODULATOR SYSTEM AND METHOD

(71) Applicant: Rockwell Collins, Inc., Cedar Rapids, IA (US)

(72) Inventors: Ronald D. Esman, McLean, VA (US); Mark A. Laliberte, McLean, VA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 573 days.

(21) Appl. No.: 16/141,170

(22) Filed: Sep. 25, 2018

(51) Int. Cl.
| | | |
|---|---|---|
| H04B 10/04 | (2006.01) | |
| G02B 5/20 | (2006.01) | |
| G01R 33/36 | (2006.01) | |
| G02B 27/28 | (2006.01) | |
| H04B 10/50 | (2013.01) | |
| H04B 10/516 | (2013.01) | |

(52) U.S. Cl.
CPC ........... *G02B 5/20* (2013.01); *G01R 33/3607* (2013.01); *G02B 27/283* (2013.01); *H04B 10/5057* (2013.01); *H04B 10/5165* (2013.01)

(58) Field of Classification Search
CPC ............ H04B 10/5057; H04B 10/5165; H04B 10/40; H04B 10/50575; H04B 10/50577; H04B 10/50579; H04B 10/541; H04B 10/548; H04B 10/532; H04B 10/2575; H04B 10/2507; H04J 14/06

USPC ......... 398/183, 184, 188, 186, 187, 152, 65, 398/158, 159, 193, 194, 195, 198, 197, 398/196, 201, 135, 136, 33, 38, 161, 115; 359/237, 238, 245, 248, 239

See application file for complete search history.

(56) References Cited

U.S. PATENT DOCUMENTS

| | | | | |
|---|---|---|---|---|
| 7,587,144 | B2 * | 9/2009 | Ilchenko | ................. G02F 1/011 398/183 |
| 2011/0044702 | A1 * | 2/2011 | Mizuguchi | ......... H04B 10/5161 398/184 |
| 2020/0076511 | A1 * | 3/2020 | Lim | ................... H04B 10/6164 |

* cited by examiner

*Primary Examiner* — Hanh Phan
(74) *Attorney, Agent, or Firm* — Suiter Swantz pc llo (57) ABSTRACT

A photonic processor includes a modulator, an optical filter, and a polarization combiner. The modulator is configured to receive an electronic signal, first optical control signal, and first optical operating signal, the first optical operating signal received from an optical source circuit on a first path having a first length, the first optical control signal received from an optical control circuit on the first path; modulate the first optical operating signal using the electronic signal to provide an intensity-modulated optical operating signal comprising a first optical operating carrier, first sideband, and second sideband; and modulate the first optical control signal using the electronic signal to provide an intensity-modulated control signal comprising a first optical control carrier. The optical filter is configured to extract the first optical operating carrier and first sideband from the intensity-modulated optical operating signal and provide the second sideband and the control carrier.

20 Claims, 7 Drawing Sheets

CROSS-POLARIZATION SINGLE SIDEBAND OPTICAL MODULATOR SYSTEM AND METHOD

BACKGROUND

The present disclosure generally relates to critical embedded systems. More particularly, the present disclosure relates to systems and methods for cross-polarization single sideband optical modulators.

As the global mobile data traffic increases rapidly, broadband wireless communication systems that can support high data rates are actively being pursued and beneficial. Radio-over-fiber (RoF) technology utilizes an optical fiber, featuring ultra-low transmission loss and ultra-wide bandwidth, to transmit radio frequency (RF) signals in the form of an optical signal. Despite its low loss and wide bandwidth characteristics, a single mode optical fiber has chromatic dispersion and is hindered by environmental noise that affects the transmitted optical RF signal, which results in performance degradation of the overall RoF system. Current work arounds include complex systems and special device integration that leverage unique components and/or substantially complete suppression of unwanted environmental noise. These solutions are inefficient, expensive, and cumbersome to implement.

SUMMARY

In one aspect, the inventive concepts disclosed herein are directed to a photonic processor. The photonic processor includes a modulator, an optical filter, and a polarization combiner. The modulator is configured to receive an electronic signal, a first optical control signal, and a first optical operating signal, the first optical operating signal received from an optical source circuit on a first path having a first length, the first optical control signal received from an optical control circuit on the first path having the first path length; modulate the first optical operating signal using the electronic signal to provide an intensity-modulated optical operating signal comprising a first optical operating carrier, a first sideband, and a second sideband; and modulate the first optical control signal using the electronic signal to provide an intensity-modulated optical control signal comprising a first optical control carrier, a third sideband, and a fourth sideband. The optical filter is configured to extract the first optical operating carrier and the first sideband from the intensity-modulated optical operating signal; and provide the second sideband and the first optical control carrier to the polarization combiner. The polarization combiner is configured to receive the second sideband and the first optical control carrier from the first path; receive a second optical control carrier and a second optical operating carrier, the second optical operating carrier received from the optical source circuit on a second path having a second path length, the second optical control carrier received from the optical control circuit on the second path having the second path length; modify the second optical operating carrier to provide a modified second optical operating carrier orthogonally polarized to the first optical operating carrier; modify the second optical control carrier to provide a modified second optical control carrier orthogonally polarized to the first optical control carrier; combine the second sideband and the modified second optical operating carrier to provide an electronic signal-modulated single sideband optical signal cross-polarized with the modified second optical signal carrier; and combine the first optical control carrier and the modified second optical control carrier to provide a control carrier cross-polarized with the second optical control carrier.

In a further aspect, the inventive concepts disclosed herein are directed to a method. The method includes receiving, by a modulator, an electronic signal, a first optical control signal, and a first optical operating signal, the first optical operating signal received from an optical source circuit on a first path having a first length, the first optical control signal received from an optical control circuit on the first path having the first path length; modulating, by the modulator, the first optical operating signal using the electronic signal to provide an intensity-modulated optical operating signal comprising a first optical operating carrier, a first sideband, and a second sideband; modulating, by the modulator, the first optical control signal using the electronic signal to provide an intensity-modulated optical control signal comprising a first optical control carrier, a third sideband, and a fourth sideband; filtering, by an optical filter, the first optical operating carrier and the first sideband from the intensity-modulated optical operating signal and the third sideband and the fourth sideband from the intensity-modulated optical control signal; passing, by the optical filter, the second sideband and the first optical control carrier to a polarization combiner; receiving, by the polarization combiner, the second sideband and the first optical control carrier from the first path; receiving, by the polarization combiner, a second optical control carrier and a second optical operating carrier, the second optical operating carrier received from the optical source circuit on a second path having a second path length, the second optical control carrier received from the optical control circuit on the second path having the second path length; combining, by the polarization combiner, the second sideband and the second optical operating carrier to provide an electronic signal-modulated single sideband optical signal cross-polarized with the second optical operating carrier; and combining, by the polarization combiner, the first optical control carrier and the second optical control carrier to provide a control carrier cross-polarized with the second optical control carrier.

In a further aspect, the inventive concepts disclosed herein are directed to a photonic processor. The photonic processor includes a low biased amplitude modulator, an optical filter, and a polarization combiner. The low biased amplitude modulator is configured to receive an electronic signal, a first optical control signal, and a first optical operating signal, the first optical signal received from an optical source circuit on a first path having a first length, the first optical control signal received from an optical control circuit on the first path having the first path length; modulate the first optical operating signal using the electronic signal to provide an amplitude-modulated optical operating signal comprising a first sideband and a second sideband; and modulate the first optical control signal using the electronic signal to provide an amplitude-modulated control signal comprising a first optical control carrier, a third sideband, and a fourth sideband. The optical filter is configured to extract the first sideband from the amplitude-modulated optical operating signal; and provide the second sideband and the first optical control carrier. The polarization combiner is configured to receive the second sideband and first optical control carrier from the first path; receive a second optical control carrier and a second optical operating carrier, the second optical operating carrier received from the optical source circuit on a second path having a second path length, the second optical control carrier received from the optical control circuit on the second path having the second path length;

combine the second sideband and the second optical operating carrier; and combine the first optical control carrier and the second optical control carrier.

DETAILED DESCRIPTION

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), or both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features which may not necessarily be expressly described or inherently present in the instant disclosure.

Broadly, embodiments of the inventive concepts disclosed herein are directed to systems and methods for using a cross-polarization single sideband optical modulator (e.g., photonic processor) system. The use of cross-polarization single sideband optical modulator system or photonic processor system described herein leverages a practical, stable way to create an electronic signal- (e.g., RF-) modulated single sideband optical signal cross polarized with the optical carrier to provide modulation efficiency, suppression of unwanted spectra (e.g., unwanted sidebands, harmonics, carrier, etc.), broadband operation, and low optical loss. The inventive concepts described herein can be utilized in various types of electronic avionics applications for airborne platforms (e.g., fixed wing aircraft, rotary wing aircraft), including but not limited to flight control and autopilot systems, navigation systems, flight display systems, communications systems, phased array control, signal processing, and radar systems. While the present disclosure describes systems and methods implementable for an airborne platform, the inventive concepts disclosed herein may be used in any type of environment (e.g., in another aircraft, a spacecraft, an autonomous vehicle, a ground-based vehicle, a water-based or underwater vehicle, a subsurface or subterranean vehicle, a satellite, an aeronautical platform, or in a non-vehicle application such as a stationary communications, sensing, or testing system, a ground-based display system, an air traffic control system, a radar system, a virtual display system).

In some embodiments, a photonic processor includes a modulator, an optical filter, and a polarization combiner. The modulator is configured to receive an electronic signal, a first optical control signal, and a first optical operating signal, the first optical operating signal received from an optical source circuit on a first path having a first length, the first optical control signal received from an optical control circuit on the first path having the first path length; modulate the first optical operating signal using the electronic signal to provide an intensity-modulated optical operating signal comprising a first optical operating carrier, a first sideband, and a second sideband; and modulate the first optical control signal using the electronic signal to provide an intensity-modulated optical control signal comprising a first optical control carrier, a third sideband, and a fourth sideband. The optical filter is configured to extract the first optical operating carrier and the first sideband from the intensity-modulated optical operating signal; and provide the second sideband and the first optical control carrier to the polarization combiner. The polarization combiner is configured to receive the second sideband and the first optical control carrier from the first path; receive a second optical control carrier and a second optical operating carrier, the second optical operating carrier received from the optical source circuit on a second path having a second path length, the second optical control carrier received from the optical control circuit on the second path having the second path length; modify the second optical operating carrier to provide a modified second optical operating carrier orthogonally polarized to the first optical operating carrier; modify the second optical control carrier to provide a modified second optical control carrier orthogonally polarized to the first optical control carrier; combine the second sideband and the modified second optical operating carrier to provide an electronic signal-modulated single sideband optical signal cross-polarized with the modified second optical signal carrier; and combine the first optical control carrier and the modified second optical control carrier to provide a control carrier cross-polarized with the second optical control carrier.

The system can be integrated with an airborne platform or other platform as described herein. For example, the optical modulator system described herein can be associated with an avionics system of an airborne platform that controls one or more aircraft cockpit displays and/or manages electronic communications between critical and non-critical systems.

In some embodiments, the optical modulator system enables a signal structure system using standard (e.g., non-specialized or non-tailored) devices that allows for a greater efficiency, easier use, a wide range of customization, and a wide variety of configurations compared to other signal structure systems. For example, the optical modulator system can be path and direction independent, providing customization and implementation into a wide variety of electronic systems. In some embodiments, the optical modulator system can provide passage of multiple optical carriers, polarization rotation, and polarization combining with coherence while avoiding the use of a multi-chip module design, which may be expensive or experience supply chain issues. The optical modulator system can provide modularity as each component can be individually optimized, repaired, or replaced to optimize the module performance. The optical modulator system can provide modulation efficiency, as it is implementable with a wide range of modulators, including low biased, Mach-Zehnder, intensity, amplitude, and other modulators. The optical modulator system can be designed to suppress unwanted spectra (e.g., sidebands, harmonics, carrier, etc.) and similar environmental noise (e.g., non-signal interference along and around the fiber and free-space of the signal path). The optical modulator system can provide a wide range of sideband and carrier suppression. The optical modulator system can provide broadband operation with a scalability in excess of 100 GHz, while limiting optical loss. The optical modulator system can feed a phase modulator (e.g., lithium niobate), which modulates one polarization more than the other and thereby imparts a phase shift to the RF signal produced when the two polarizations are mixed (e.g., by a polarizer) and detected by a photodiode.

Figure 1:
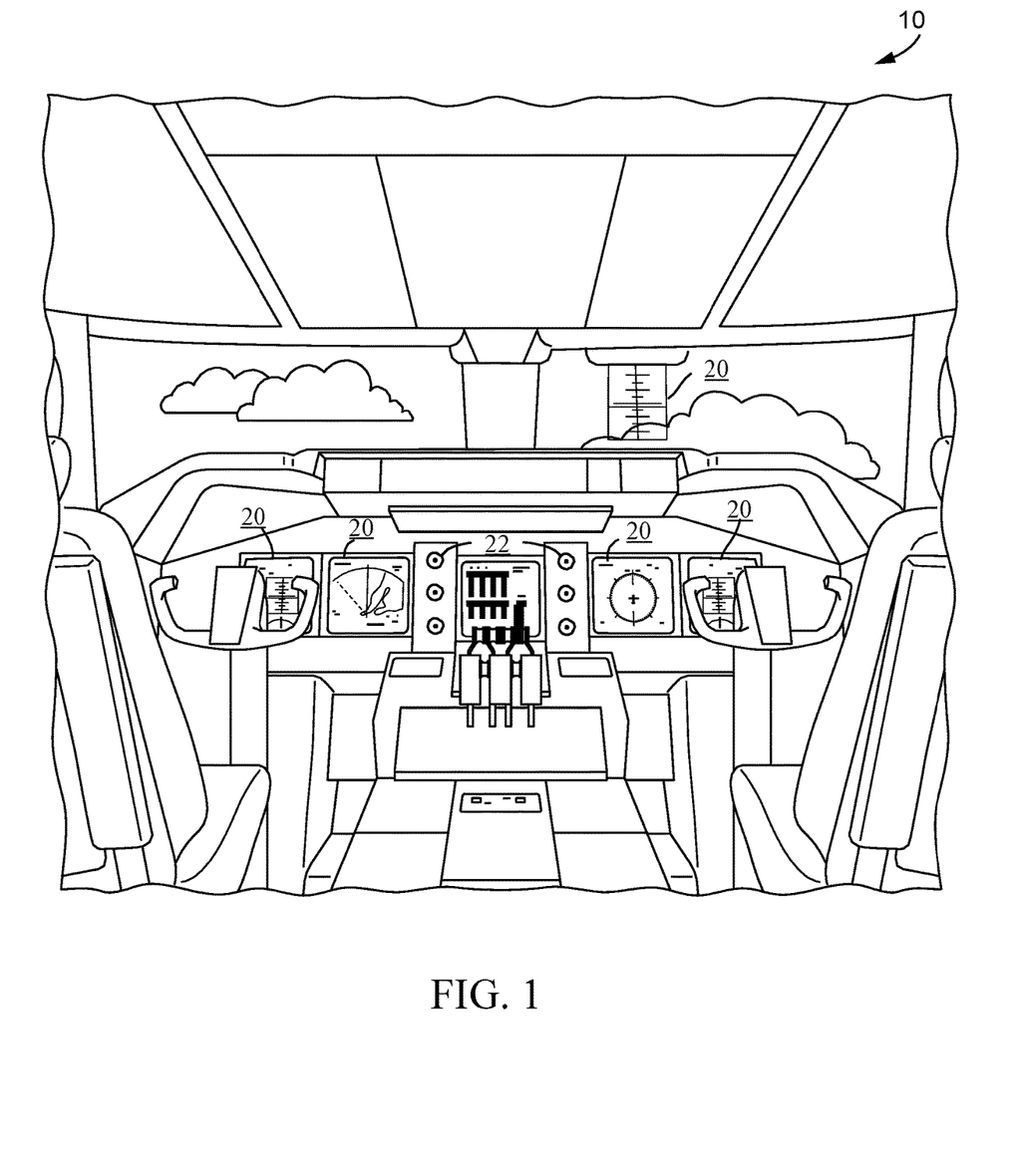
FIG. 1 is a schematic illustration of an exemplary embodiment of an aircraft control center according to the inventive concepts disclosed herein.

Referring to FIG. 1, a perspective view schematic illustration of an aircraft control center or cockpit 10 is shown according to an exemplary embodiment of the inventive concepts disclosed herein. The aircraft control center 10 can be configured for an aircraft operator or other user to interact with avionics, electronics, communications, radar, or electronic warfare systems of an airborne platform. The aircraft control center 10 may include one or more flight displays 20 and one or more user interface ("UP") elements 22.

Figure 2:
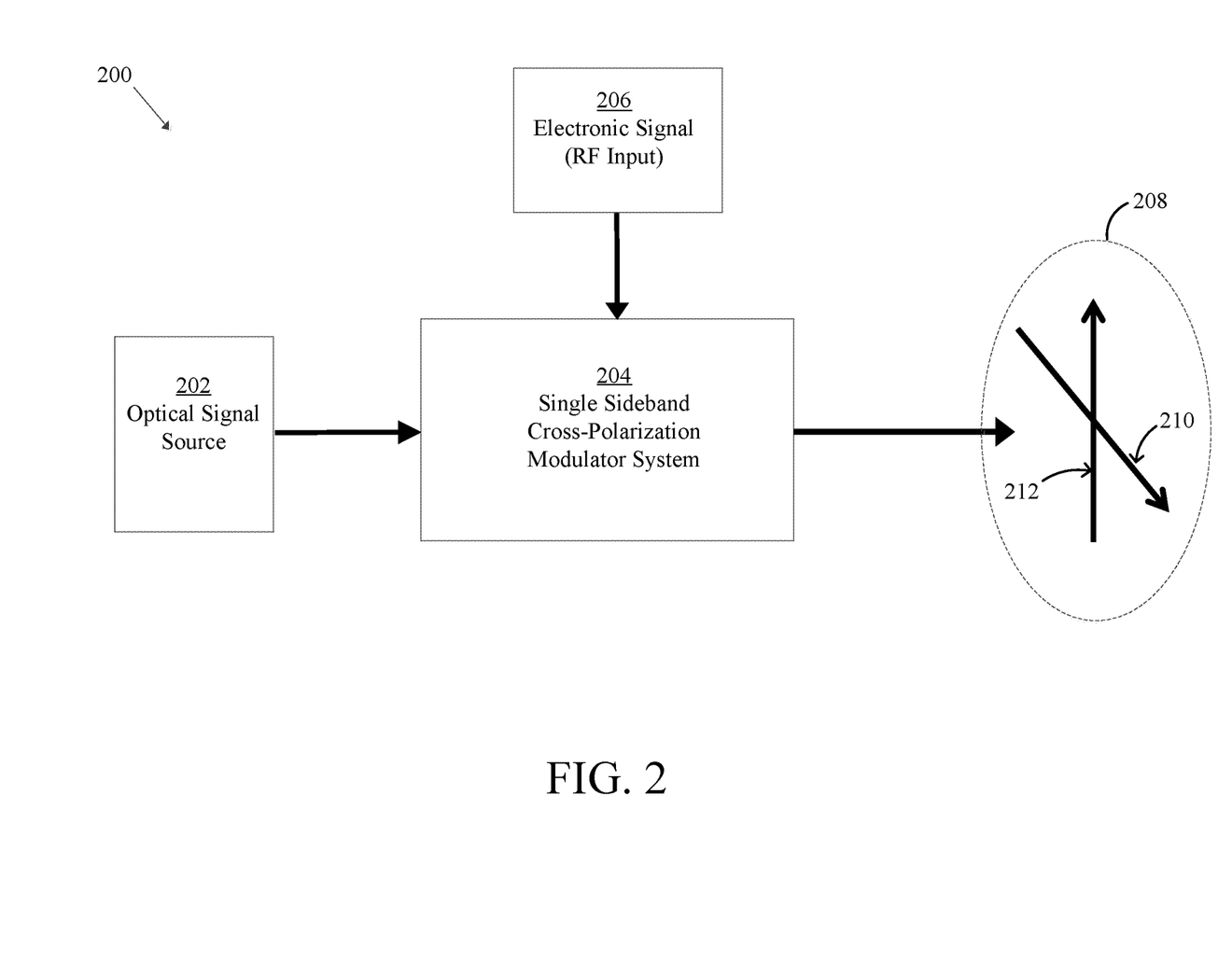
FIG. 2 is a block diagram of an exemplary embodiment of an optical modulator system utilized in an aircraft electronic system according to the inventive concepts disclosed herein.

Referring now to FIG. 2. a block diagram of an exemplary embodiment of an optical modulator system 200 that can be utilized in the aircraft electronic center 10, an aircraft electronic system, or other electronic system is shown. Generally, the optical modulator system 200 splits an optical operating signal 202 on a first path (e.g., of fiber) and a second path (e.g., of fiber) within a single sideband cross-polarization modulator system 204. The first path can be modulated by an electronic signal 206 and filtered and the second path can be polarization rotated. The signal of the first path and the signal of the second path are combined in a polarization beam combiner in cross polarized states. In other modulator systems, this configuration might be useless due to the introduction of phase noise between the first path and the second path. However, as described in greater detail below, the optical modulator system 200 utilizes a second optical control signal to stabilize the first path and the second path.

The optical modulator system 200 executes functions including modulating an optical operating signal 202 (e.g., laser light) with an electronic signal 206, and using a single sideband cross-polarization modulator system 204 to provide an electronic signal-modulated single sideband optical operating signal 212, cross-polarized with a rotated optical operating carrier 210 ("cross-polarized single sideband and optical carrier 208"). The optical operating signal 202 can be of a single polarization. The electronic signal 206 can be an RF input, such as an RF signal in the range of 0 to 100 GHz. The rotated optical operating carrier 210 can be orthogonally polarized relative to the single sideband 212. For example, the cross-polarized single sideband and optical carrier 208 can include a rotated optical operating carrier 210 on the x-axis, and a single sideband 212 on the y-axis. The rotated optical operating carrier 210 can be unmodulated (e.g., unperturbed) and the single sideband 212 can be modulated, which can make it easier to combine the rotated optical operating carrier 210 and the single sideband 212 using a polarization combiner to provide the cross-polarized single sideband and optical carrier 208. Since the cross-polarized single sideband and optical carrier 208 travel in the same waveguide (or fiber), environment effects on the optical phase of the vertical light (e.g., single sideband 212) may be the same as on the horizontal light (e.g., rotated optical operating carrier 210) When the subsequent processing system combines the polarizations (e.g., with a polarizer), the phases of the single sideband 212 and rotated optical operating carrier 210 are subtracted, thus removing environment effects common to both polarizations.

The optical modulator system 200 can be configured such that the phase adjustment of the rotated optical operating carrier 210 will be a relative adjustment to the single sideband 212. For example, the stabilization of a second path of the rotated optical operating carrier 210 with a first path of the single sideband 212 will cause the first path to be in optical phase relative to the second path. As will be appreciated, the optical modulator system 200 can be configured such that the optical operating carrier is on the y-axis and a rotated single sideband is on the x-axis, that rotated optical operating carrier is on the x-axis and a single sideband is on the y-axis, or other combinations and configurations. The optical modulator system 200 can receive multiple channel signals, with each channel having a different phase input on the optical operating carrier 210. The optical modulator system 200 may be used for a phase array antenna control by first splitting the signal 208 into N channels to feed N elements and then, on each channel, shifting the optical phase of one polarization relative to the other, for example by using lithium niobate phase modulators.

Figure 3A:
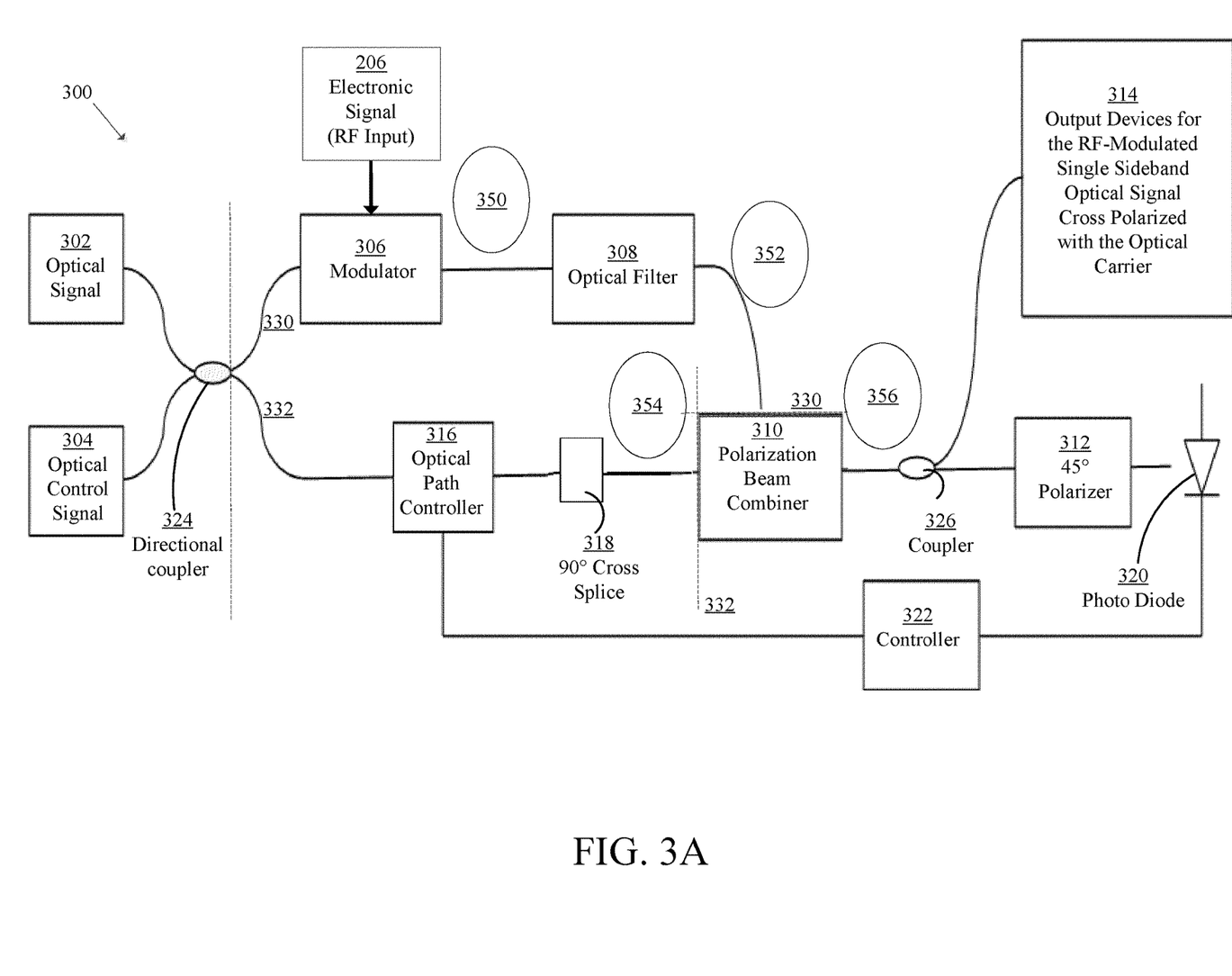
FIG. 3A is a schematic diagram of an optical modulator system with a quad-based modulator according to the inventive concepts disclosed herein.
Figure 3B:
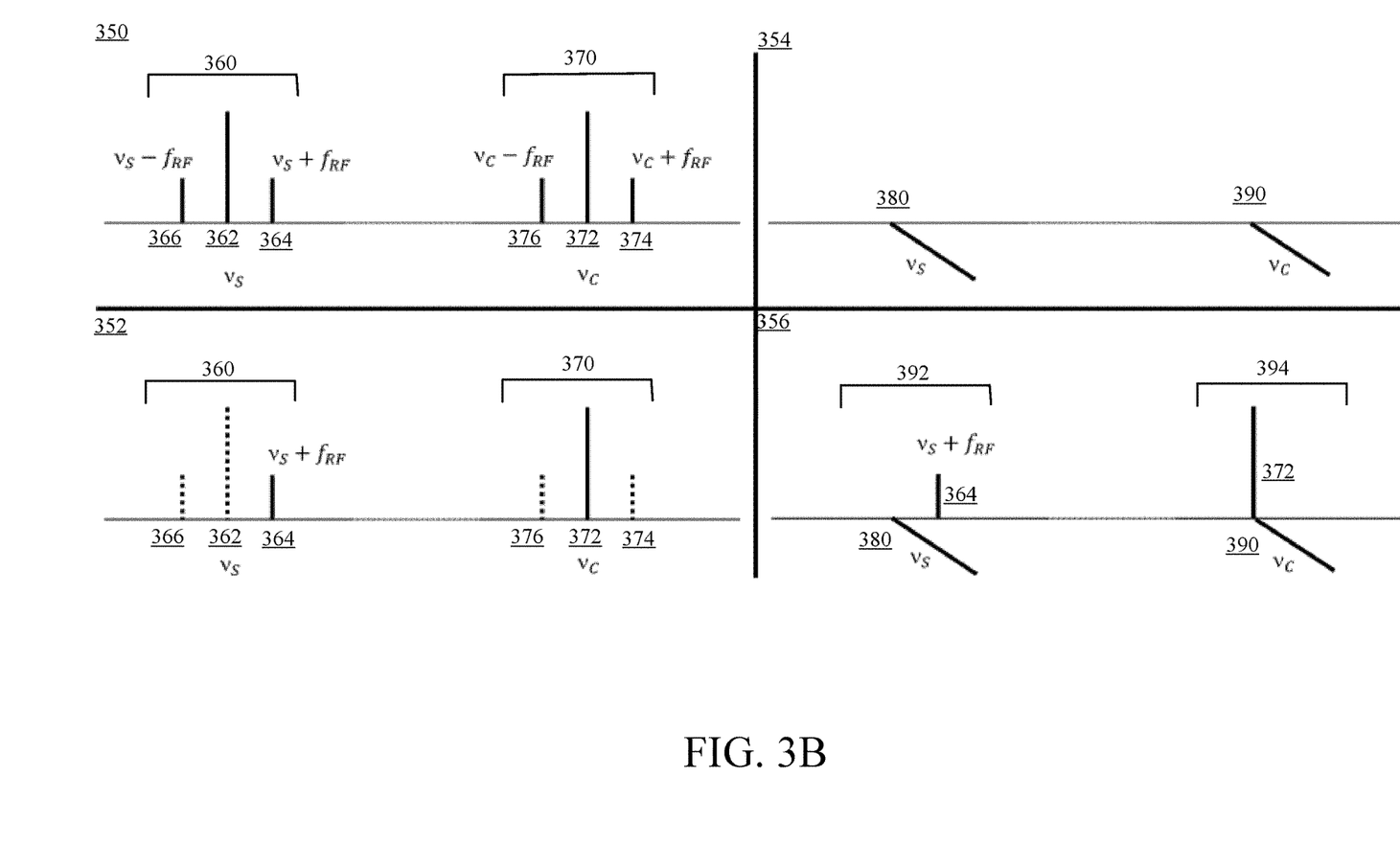
FIG. 3B is an optical spectrum diagram at various points along the schematic diagram of FIG. 3A.

Referring now to FIGS. 3A and 3B, a schematic diagram of an optical modulator system 300 according to an exemplary embodiment of the inventive concepts disclosed herein is shown, and an optical spectrum diagram at various points along the schematic diagram of the optical modulator system 300 of FIG. 3A is shown in FIG. 3B. As will be appreciated, the optical modulator system 300 is similar to (e.g., a configuration of) the optical modulator system 200. For example, the optical operating signal 202 source is similar to the optical operating signal 302 and the optical control signal 304; the single sideband cross-polarization modulator system 204 can include the directional coupler 324, the modulator 306, the optical filter 308, the optical path controller 316, the 90-degree cross splice 318, the polarization beam combiner 310, the coupler 326, the 45-degree polarizer 312, the photo diode 320, and the controller 322; and the cross-polarized single sideband and optical carrier 208 can include the RF-modulated single sideband optical signal cross-polarized with the optical carrier 356. As will be appreciated, the lines connecting the various components of the optical modulator system 300 can be made of optical fiber, waveguide, or a similar connecting medium for communication, including free space.

As referred to herein, the first path 330 is the distance from the directional coupler 324, along the optical fiber and through the modulator 306 and optical filter 308, through the polarization combiner 310, through coupler 326, to the forty-five degree polarizer 312. The second path 332 is the distance from the directional coupler 324, along the optical fiber and through the optical path controller 316 and 90-degree cross splice 318, through the polarization combiner 310, to the forty-five degree polarizer 312. The first path 330 and the second path 332 both start at coupler 324 and end at polarizer 312. The cross splice 318 can include a splice of two fibers having orthogonal axes. The cross splice 318 can include a polarization rotation device. The cross splice 318 can include a twist in fiber, resulting in polarization rotation of signals passing through the twist in the fiber. The polarization combiner 310 can include the 90-degree cross splice 318. The polarization combiner 310 can include interfaces for receiving signals such that a first received signal is rotated to be orthogonal to a second received signal. The optical modulator system 300 splits the optical operating signal 302 and the optical control signal 304 along the first path 330 and the second path 332. Generally, along the first path 330, the optical operating signal 302 and the optical control signal 304 are modulated using the electronic signal 305, and filtered. Along the second path 332, the optical operating signal 302 and the optical control signal 304 are polarization rotated. The optical path length controller 316 is shown on the second path, but could be included as part of the first path instead.

Expanding upon the first path 330, the directional coupler 324 sends the optical operating signal 302 and the optical control signal 304 along the first path 330 to the modulator 306. The modulator 306 may be a modulator, a quad-biased Mach Zehnder modulator, a low-biased Mach-Zehnder modulator, an intensity modulator, an amplitude modulator, or similar modulator. The modulator 306 receives the electronic signal 305, for example, as an RF input. The modulator 306 modulates the optical operating signal 302 using the electronic signal 305 to provide an intensity-modulated optical operating signal 360 at point 350 on the first path 330. The modulator 306 modulates the optical control signal 304 using the electronic signal 305 to provide an intensity-modulated optical control signal 370 at point 350 on the first path 330. As shown in FIG. 3B, the intensity-modulated optical operating signal 360 includes the first optical operating carrier 362 ($v_s$), a lower sideband 366 ($v_s-f_{RF}$), and an upper sideband 364 ($v_s+f_{RF}$). The intensity-modulated optical control signal 370 includes a first optical control carrier 372 ($v_c$), a lower sideband 376 ($v_c-f_{RF}$), and an upper sideband 374 ($v_c+f_{RF}$). It will be appreciated that in various embodiments, various numbers of sidebands may be present in the signals 360, 370. In some embodiments, the optical control signal 304 is a broadband source and will therefore not produce discernable sidebands when modulated by the modulator 306 (e.g., individual sidebands may not have a discernable signal strength relative to bands at other frequencies). In various such embodiments, and as discussed in greater detail herein, the optical control signal 304 can still be used to identify path length differences and to adjust and stabilize the path length such that the second path 332 is in optical phase relative to the first path 330 or vice versa. The term "in optical phase" can refer to controlling the relative optical path length difference between the first and second path to be much less than a fraction of (e.g., less than one percent of) the corresponding wavelength of light being manipulated by the optical modulator system 300.

The intensity-modulated optical operating signal 360 and the intensity-modulated optical control signal 370 are received by the optical filter 308. The optical filter 308 may be an interleaver or similar optical filter device. The interleaver as the optical filter 308 may provide finely tuned filtering options due to the very sharp and well-defined filtering ranges, which can be beneficial because the frequencies of the optical operating carrier 362 and the optical single sideband signal 366 are relatively close. The optical filter 308 filters (e.g., the filter extracts the bands from the input signal(s) to be absent from the output signal(s)) the intensity-modulated optical operating signal 360 and the intensity-modulated control signal 370 to provide the upper sideband 364 and first optical control carrier 372, respectively, at point 352 on the first path 330. As shown in FIG. 3B, by judicious selection of wavelengths of the optical sources and the optical filters, the lower sideband 366 and the first optical operating carrier 362 have been filtered out of the intensity-modulated optical operating signal 360, leaving the upper sideband 364. The lower sideband 376 and the upper sideband 374 have been filtered out of the intensity-modulated optical control signal 370, leaving the first optical control carrier 372. In some embodiments, all sidebands of the intensity-modulated optical control signal 370 are filtered out, as the first optical control carrier 372 is the optic used to stabilize the second path 332 with the first path 330. The upper sideband 364 and first optical control carrier 372 are received by the polarization combiner 310.

In some embodiments, the upper sideband 364 and first optical operating carrier 362 are extracted by the optical filter 308 and the lower sideband 366 is provided. The optical modulator system 300 can be sideband independent, as either a lower sideband or an upper sideband may be used. The filtering described above by the optical filter 308 may be accomplished using a single filter device or by multiple filter devices, depending on the modulating frequencies involved and the type of technology in the optical filter 308. For example, the optical filter 308 could include a first interleaver being vernierly-related to a second interleaver, where the first interleaver can be configured to extract the first optical carrier from the intensity-modulated optical operating signal and the second interleaver may be configured to extract the first sideband from the intensity-modulated optical operating signal and to extract the third sideband and fourth sideband from the intensity-modulated control signal.

Turning to the second path 332, the directional coupler 324 sends the optical operating signal 302 and the optical control signal 304 along the second path 332 through the optical path controller 316 to the 90-degree cross splice 318. The optical path controller 316 can be configured to adjust the length of the second path 332. Generally, the adjustment stabilizes the length of the second path 332 with the length of the first path 330 such that the optical phase of the second path 332 is stable relative to the first path 330. The optical path controller 316 is described in greater detail below. The 90-degree cross splice 318 receives the unmodulated optical operating signal 302 and the optical control signal 304. The 90-degree cross splice 318 can modify the received signals to provide orthogonal output signals. For example, the 90-degree cross splice 318 can rotate the unmodulated optical signal 302 ninety degrees to provide a modified second optical signal carrier 380 rotated ninety degrees relative to the optical operating signal 302 (e.g., optical operating carrier) and rotate the optical control signal 304 ninety degrees to provide a modified second optical control carrier 390 rotated ninety degrees relative to the optical control signal 304, as shown in FIG. 3B. In some embodiments, the rotated second optical operating carrier 380 is a polarization rotated second optical carrier rotated ninety degrees relative to the second optical operating carrier, and the rotated second optical control carrier 390 is a polarization rotated second optical control carrier rotated ninety degrees relative to the second optical control carrier. As will be appreciated, the signals do not have to be rotated relative to one another by exactly 90 degrees. Sufficiently good performance could be obtained with signals that are not exactly at 90 degree, but 90 degrees is preferred. In some embodiments, one signal is rotated within the range of 80-95 degrees relative to the other signal. In some embodiments, one signal is rotated within the range of 88-90 degrees relative to the other signal. In some embodiments, the 90-degree cross splice 318 is implemented within and accomplished by the polarization combiner 310.

The polarization combiner 310 receives the upper sideband 364 and first optical control carrier 372 from the first path 330 and the modified second optical operating carrier 380 and modified second optical control carrier 390 from the second path 332. Specifically, the polarization combiner 310 combines the first optical control carrier 372 from the optical control signal 304 along first path 330 and the modified second optical control carrier 390 (e.g., second optical control carrier) of the optical control signal 304 along the second path. As an end result, and at point 356, the polarization combiner 310 can provide an unmodulated control carrier cross polarized with the second optical control signal (signal 394). The polarization combiner 310 combines the upper sideband 364 from the optical operating signal 302 along first path 330 and the modified second optical signal 380 of the optical operating signal 302 along the second path. As an end result, and at point 356, the polarization combiner 310 can provide an electronic signal-modulated single sideband optical signal cross polarized with the rotated second optical signal (signal 392). The electronic signal-modulated single sideband optical signal cross polarized with the rotated second optical signal 392 is the desired end result; however, due to the different paths 330, 332 taken by the signals combined to generate the signals 392, 394, and due to instability along those paths (e.g., temperature differences, fiber vibrations, fiber imperfections, environmental noise, etc.) that the light path is sensitive to, the signal-modulated single sideband optical signal may exhibit unstable phase relative to the modified second optical signal. Accordingly, the unmodulated control carrier cross polarized with the second optical control signal 394 can be used to adjust the path lengths to have the second path 332 be in stable optical phase relative to the first path 330.

In some embodiments, the optical filter 308 utilizes a Faraday rotator mirror, bi-directional non-PM (non-polarization maintaining) filtering device, and a polarization beam splitter. The polarization beam splitter receives light from the modulator 306 on a first polarization, the light is filtered by the optical filter on the first polarization, the Faraday rotator mirror reflects the light orthogonally on a second polarization, the light is then filtered during a second pass through the optical filter on a second polarization, the doubly-filtered light enters the polarization beam splitter on the second polarization, and is directed to the polarization beam combiner 310. The bi-direction non-PM device may include an interleaver. This configuration can enhance the filtering function and converts the non-polarization maintaining optical filter 308 to a polarization maintaining device.

The unmodulated control carrier cross polarized with the second optical control signal 394 is received by the coupler 326. The coupler 326 passes the unmodulated (or relatively unmodulated) control carrier cross polarized with the second optical control signal 394 through the 45-degree polarizer 312. The 45-degree polarizer 312 mixes the first optical control carrier 372 with the modified second optical control carrier 390 such that the first optical control carrier 372 can be compared to the modified second optical control carrier 390 by a device (e.g., the photo diode 320). The photo diode 320 (e.g., light sensor) can be configured to detect any changes in the unmodulated control carrier cross polarized with the second optical control signal 394, or in other words, the changes between the optical control signal 304 along first path 330 and the second optical control carrier 390 along the second path 332. As such, the photo diode 320 can detect path length differences between the different control lights on the different paths.

The controller 322 receives the length difference signal from the photo diode 320 and determines a path length adjustment for the length of the second path 332 in order to adjust and stabilize the second path length with regard to the first path length such that the second path 332 is in optical phase relative to the first path 330. The path length adjustment can be sent to the optical path controller 316 that adjusts the length of the second path 332 accordingly. The controller 322 and/or optical path controller 316 adjusts the optical path length by using at least one of charging a piezoelectrical material that is attached to the second path length to change length of the second path length, altering an index of refraction within the second path length, altering an optical length through the second path length, utilizing temperature-controlled fiber, or implementing a voltage controlled speed of light device. In some embodiments, the controller 322 and the optical path controller 316 are the same device. In some embodiments, the controller 322 and the optical path controller 316 interface and adjust the length of the first path 330.

The photo diode 320 will continue to detect any changes in the unmodulated control carrier cross polarized with the second optical control signal 394 until the horizontal and vertical light are phase stable with respect to each other (e.g., until signals of the paths 330, 332 are coherent). Accordingly, the controller 322 and the optical path controller 316 can identify a path length change, as indicated by the photo diode, until the horizontal and vertical light are coherent with each other. As will be appreciated, the photo diode 320, controller 322, and optical path adjuster 316 can iteratively execute these functions until the horizontal and vertical light are coherent, and can resume these functions responsive to the photo diode 320 detecting incoherence or phase drift. Once the second path 332 is in optical phase relative to the first path 330, the resulting electronic signal-modulated single sideband optical signal cross polarized with the rotated second optical signal 392 is received by the output devices 314 that can use the signal in communications and may adjust or manipulate the signal further. The output devices 314 may be polarization-dependent phase shifters, forty-five degree polarizers, RF outputs, and other similar devices. In some embodiments, the polarization-dependent phase shifter includes a lithium niobate phase shifter, for which as a voltage is applied, the resultant optical phase shifts on one polarization more than the other. In some embodiments, the forty-five degree polarizer is included as part of output devices 314 in order to stabilize path lengths of the two polarizations along the fiber connecting the polarization beam combiner 310 to output device 314.

While the optical modulator system 300 is shown flowing left to right, the optical modulator system 300 may be configured to flow right to left. Additionally, the optical modulator system 300 may be adjusted such that the optical operating signal 302 travels in one direction (e.g., left to right) and the optical control signal 304 may travel in the opposite direction (e.g., right to left). In this example, optical control signal 304 and photodiode 320 would exchange places in the configuration. The bi-directional configurations may be beneficial if the optical control signal 304 interferes with the optical operating signal 302 when they travel in the same direction. Additionally, non-laser light (e.g., non-coherent light) may be used as the optical operating signal 302 and/or the optical control signal 304. In some embodiments, the sidebands of the optical control signal 304 do not need to be filtered off if the photo diode 320 and controller 322 are configured to ignore the sidebands of the optical control signal 304 (e.g., configured with a low-pass filter so as to filter out the signal associated with RF input 206).

Figure 4A:
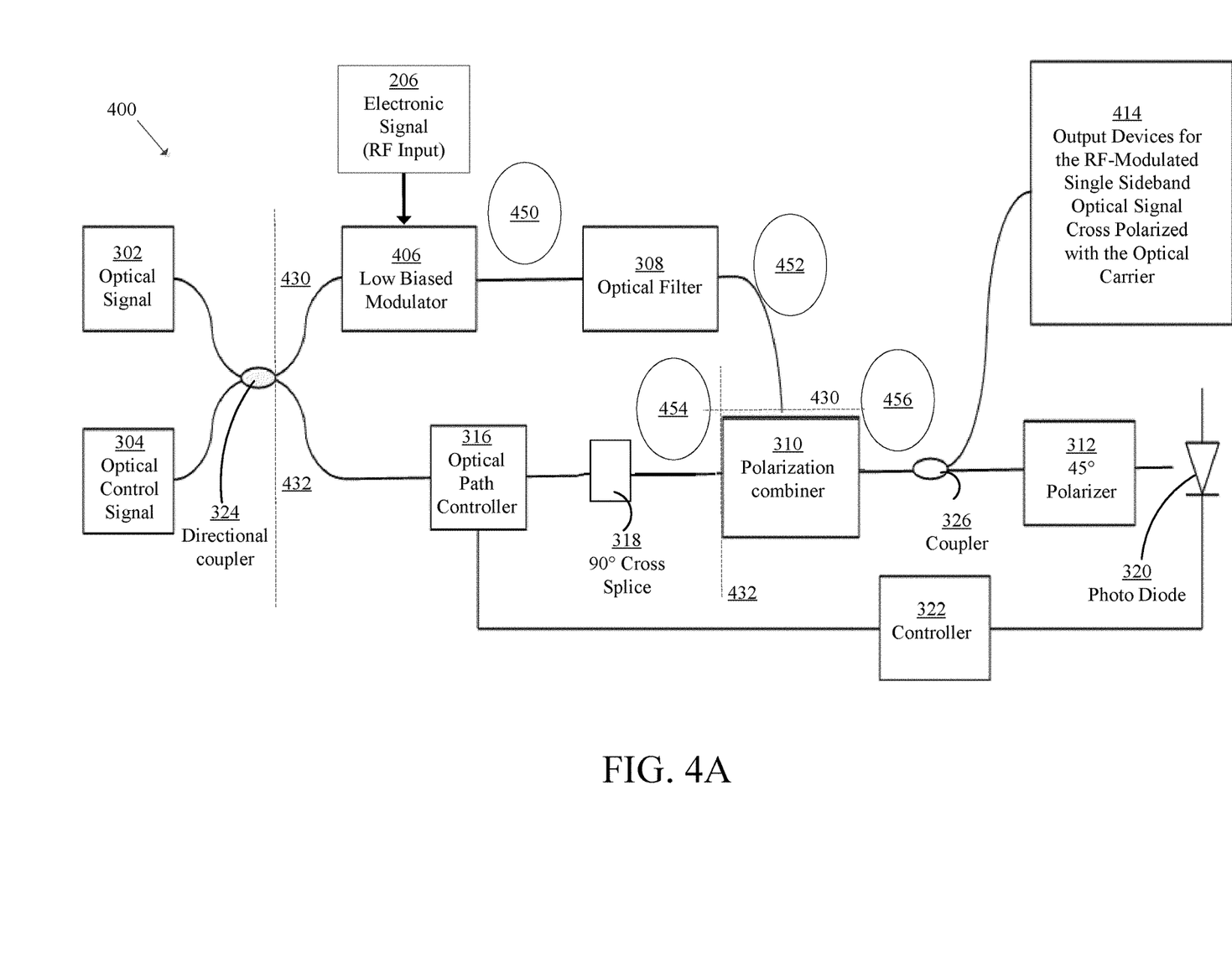
FIG. 4A is a schematic diagram of an optical modulator system with a low bias modulator according to the inventive concepts disclosed herein.
Figure 4B:
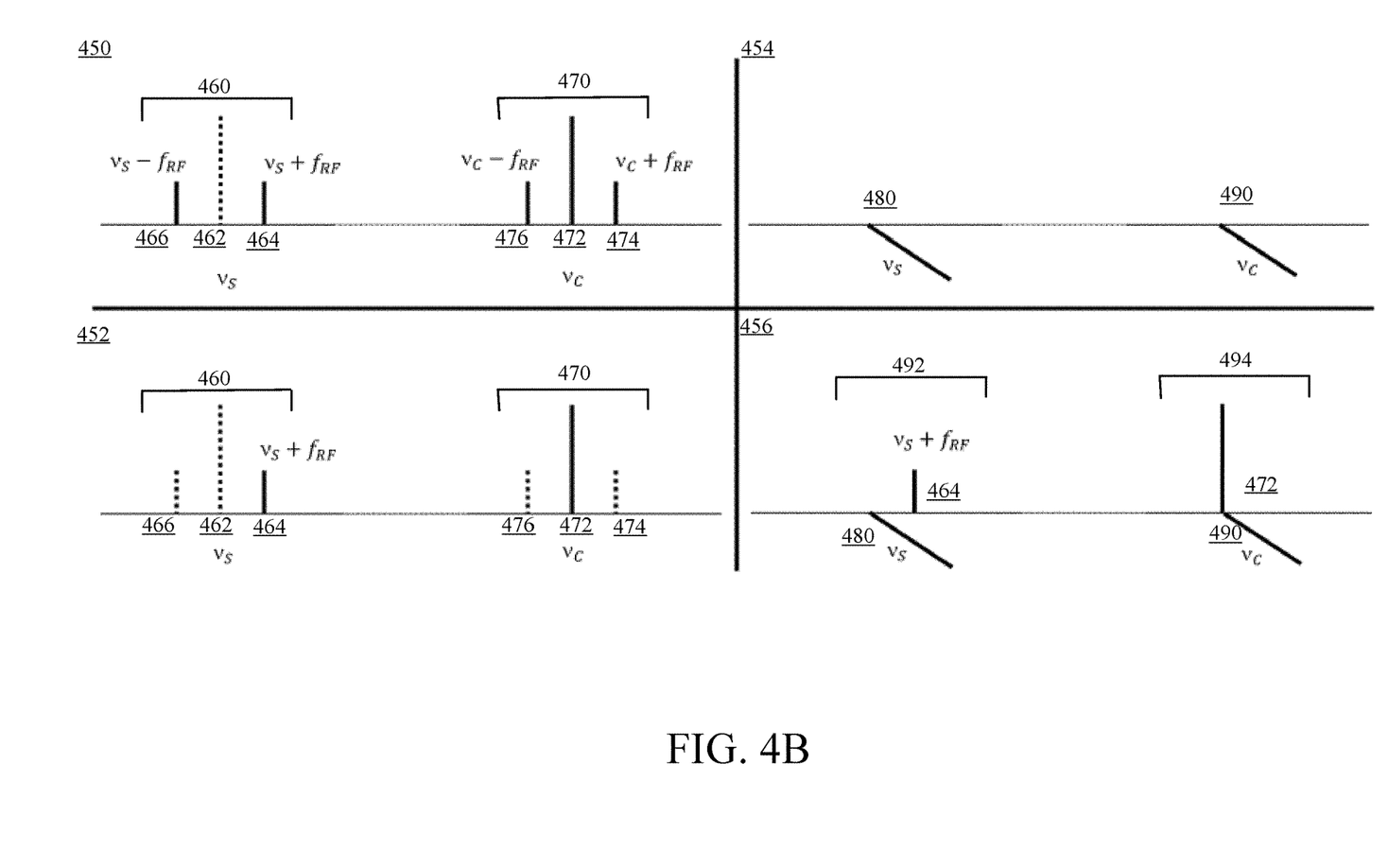
FIG. 4B is an optical spectrum diagram at various points along the schematic diagram of FIG. 4A.

Turning to FIGS. 4A and 4B, a schematic diagram of an optical modulator system 400 with a low-biased modulator is shown in FIG. 4A. The optical spectrum diagram at various points along the schematic diagram of the cross-polarization single optical modulator system 400 of FIG. 4A is shown in FIG. 4B. As will be appreciated, the optical modulator system 400 can include features of the optical modulator system 300. A difference between the optical modulator system 400 and the optical modulator system 300 is the optical modulator system 400 uses a low-biased modulator. The lines connecting the various components of the optical modulator system 400 can be made of optical fiber, a waveguide, or a similar connecting medium for communication, including free space.

As referred to herein, the first path 430 is the distance from the directional coupler 324, along the optical fiber and through the low-biased modulator 406 and optical filter 308, through the polarization combiner 310, through coupler 326, to 45-degree polarizer 312. The second path 432 is the distance from the directional coupler 324, along the optical fiber and through the optical path controller 316 and 90-degree cross splice 318, through the polarization combiner 310, to the 45-degree polarizer 312. First path and second path both start at coupler 324 and end at polarizer 312. The optical modulator system 400 splits the optical operating signal 302 and the optical control signal 304 along the first path 430 and the second path 432. Generally, along the first path 430, the optical operating signal 302 and the optical control signal 304 are modulated by the electronic signal 305 and filtered. Along the second path 432, the optical operating signal 302 and the optical control signal 304 are polarization rotated.

Expanding upon the first path 430, the directional coupler 324 sends the optical operating signal 302 and the optical control signal 304 along the first path 430 to the low-biased modulator 406. The low-biased modulator 406 receives the electronic signal 305, for example, an RF input. The low-biased modulator 406 modulates the optical signal 302 to provide an intensity-modulated optical signal 460 at point 450 on the first path 430. The low-biased modulator 406 modulates the optical control signal 304 to provide an intensity-modulated optical control signal 470 at point 450 on the first path 430. The low-biased modulator 406 can modulate the intensity of the received signals by modulating an amplitude of the optical signals. As shown in FIG. 4B, the amplitude-modulated optical signal 460 includes a lower sideband 466 ($v_s-f_{RF}$), and an upper sideband 464 ($v_s+f_{RF}$). In some embodiments, and different from the modulator 306 of FIG. 3A, the low-biased modulator extinguishes (e.g., extracts) the first optical carrier 462 ($v_s$). The amplitude-modulated optical control signal 470 includes a first optical control carrier 472 ($v_c$), a lower sideband 476 ($v_c-f_{RF}$), and an upper sideband 474 ($v_c+f_{RF}$). In some embodiments, the optical control signal 304 has a different wavelength from the optical operating signal 302 to ensure that the first optical control carrier 472 is passed through the low-biased modulator 406. For example, the system 400 can take advantage of a Mach-Zehnder modulator typically having a limited range of wavelengths for which the low-biased condition applies and that some modulator designs can specifically limit the range. In some embodiments, the optical control signal 304 is a broadband source and will therefore not produce discernable sidebands when modulated by the low-biased modulator 406 (e.g., individual sidebands may not have a discernable signal strength relative to bands at other frequencies). In various such embodiments, and as discussed in greater detail herein, the optical control signal 304 can still be used to identify path length differences and to adjust and stabilize the path length such that the second path 432 is in optical phase relative to the first path 430 or vice versa.

The amplitude-modulated optical signal 460 and the amplitude-modulated optical control signal 470 are received by the optical filter 308. The optical filter 308 may be an interleaver or similar optical filter device. The interleaver as the optical filter 308 can provide finely tuned filtering options due to the very sharp and well-defined filtering ranges, which is beneficial because the frequencies of the single sidebands 364 and 366 are close to those of the optical carrier 462. The optical filter 308 filters the amplitude-modulated optical operating signal 460 and the amplitude-modulated optical control signal 470 to provide the upper sideband 464 and first optical control carrier 472 at point 452 on the first path 440. As shown in FIG. 4B, by judicious selection of wavelengths of the optical sources and the optical filters, the lower sideband 466 has been filtered out of the amplitude-modulated optical operating signal 460 leaving the upper sideband 464. The lower sideband 476 and the upper sideband 474 have been filtered out of the amplitude-modulated optical control signal 470 leaving the first optical control carrier 472. It can be beneficial for all sidebands of the amplitude-modulated optical control signal 470 to be filtered out as the first optical control carrier 472 is the optic needed to stabilize the second path 432 with the first path 430. The upper sideband 464 and first optical control carrier 472 are received by the polarization combiner 410.

In some embodiments, the upper sideband 464 and first optical operating carrier 462 are extracted by the optical filter 308 and the lower sideband 466 is provided. For example, the optical modulator system 400 can be sideband independent as either a lower sideband or an upper sideband may be used. The filtering described above by the optical filter 308 may be accomplished using a single device or a multi-device depending on the modulating frequencies involved and the type of technology in the optical filter 308. For example, the optical filter 308 could include a first interleaver being vernierly-related to a second interleaver, where the first interleaver may be configured to extract the first optical operating carrier from the amplitude-modulated optical operating signal and the second interleaver can be configured to extract the first sideband from the amplitude-modulated optical operating signal and to extract the third sideband and fourth sideband from the amplitude-modulated control signal.

Turning to the second path 432, the directional coupler 424 sends the optical operating signal 302 and the optical control signal 304 along the second path 432 through the optical path controller 316 to the 90-degree cross splice 318. The optical path controller 316 may be configured to adjust the length of the second path 432. Generally, the adjustment stabilizes the length of the second path 432 with the length of the first path 430 such that the optical phase of the second path 432 is stable relative to the first path 430. The optical path controller 416 is described in greater detail below. The 90-degree cross splice 318 receives the unmodulated optical operating signal 302 and the optical control signal 304. The 90-degree cross splice 318 can modify the received signals to provide orthogonal output signals. For example, the 90-degree cross splice 318 can rotate the signal 90-degrees to provide a modified second optical operating carrier 480 rotated ninety degrees relative to the optical operating signal 302 (e.g., optical carrier) and a modified second optical control carrier 490 rotated ninety degrees relative to the optical control signal 304, as shown in FIG. 4B In some embodiments, the modified second optical operating carrier 480 is a polarization rotated second optical carrier rotated ninety degrees relative to the second optical carrier and the rotated second optical control carrier 490 is a polarization rotated second optical control carrier rotated ninety degrees relative to the second optical control carrier. As will be appreciated, the signals do not have to be exactly 90 degrees. Sufficiently good performance could be obtained with signals that are not exactly at 90 degree, but 90 degrees is preferred.

The polarization combiner 310 receives the upper sideband 464 and first optical control carrier 472 from the first path 430 and the modified second optical operating carrier 480 and modified second optical control carrier 490 from the second path 432. Specifically, the polarization combiner 410 combines the first optical control carrier 472 from the optical control signal 304 along first path 430 and the modified second optical control carrier 490 (e.g., second optical control carrier) of the optical control signal 304 along the second path. As an end result, and at point 456, the polarization combiner 410 may provide an unmodulated control carrier cross polarized with the second optical control signal (signal 494). The polarization combiner 310 combines the upper sideband 464 from the optical operating signal 302 along first path 440 and the rotated second optical signal 480 of the optical signal 302 along the second path. As an end result, and at point 456, the polarization combiner 310 can provide an electronic signal-modulated single sideband optical signal cross polarized with the rotated second optical signal (signal 492). The electronic signal-modulated single sideband optical signal cross polarized with the rotated second optical signal 492 is the desired end result, however, due to the different paths 430, 432 taken by the signals combined to generate the signals 492, 494, and due to instability along those paths (e.g., temperature differences, fiber vibrations, fiber imperfections, environmental noise, etc.) that the light path is sensitive to, the signal-modulated single sideband optical signal may exhibit unstable phase relative to with the modified second optical signal. Accordingly, the unmodulated control carrier cross polarized with the second optical control signal 494 can be used to adjust the path lengths to have the second path 442 be in stable optical phase relative to the first path 440.

The unmodulated control carrier cross polarized with the second optical control signal 494 can be received by the coupler 426. The coupler 426 passes the unmodulated (or relatively unmodulated) control carrier cross polarized with the second optical control signal 494 through the 45-degree polarizer 312. The 45-degree polarizer 312 mixes the first optical control carrier 472 with the rotated second optical control carrier 490 such that the first optical control carrier 472 can be compared to the rotated second optical control carrier 490 by a device (e.g., the photodiode 320). The photo diode 320 can be configured to detect any changes in the unmodulated control carrier cross polarized with the second optical control signal 494, or in other words, the changes between the optical control signal 304 along first path 440 and the second optical control carrier 490 along the second path 442.

The controller 322 receives the length difference signal from the photo diode 320 and determines a path length adjustment for the length of the second path 432 in order to adjust and stabilize the second path length with regard to the first path length such that the second path 432 is in optical phase relative to the first path 430. The path length adjustment can be sent to the optical path controller 416 that adjusts the length of the second path 432 accordingly. The controller 322 and/or optical path controller 316 adjusts the optical path length by using at least one of charging a piezoelectric material that is attached to the second path 432 to change the length of the second path 432, altering an index of refraction within the second path 432, altering an optical length through the second path 432, utilizing temperature-controlled fiber, or implementing a voltage-controlled speed of light device, or similar path adjustment techniques. In some embodiments, the controller 322 and the optical path controller 316 are the same device. In some embodiments, the controller 322 and the optical path controller 416 interface and adjust the length of the first path 430.

The photo diode 320 can continue to detect any changes in the unmodulated control carrier cross polarized with the second optical control signal 494 until the horizontal and vertical light are phase stable with respect to each other (e.g., until signals of the paths 430, 432 are coherent). Accordingly, the controller 322 and the optical path controller 316 can identify a path length change, as indicated by the photo diode 320, until the horizontal and vertical light are coherent with each other. As will be appreciated, the photo diode 320, controller 322, and optical path adjuster 316 can iteratively execute these functions until the horizontal and vertical light are coherent, and will start up again if the photo diode 320 detects incoherence or phase drift. Once the second path 432 is in optical phase relative to the first path 430, the resulting electronic signal-modulated single sideband optical signal cross polarized with the rotated second optical signal 492 is received by the output devices 414 that can use the signal in communications and may adjust or manipulate the signal further. The output devices 414 may be polarization-dependent shifters, 45-degree polarizers, RF outputs, and other similar devices.

Figure 5:
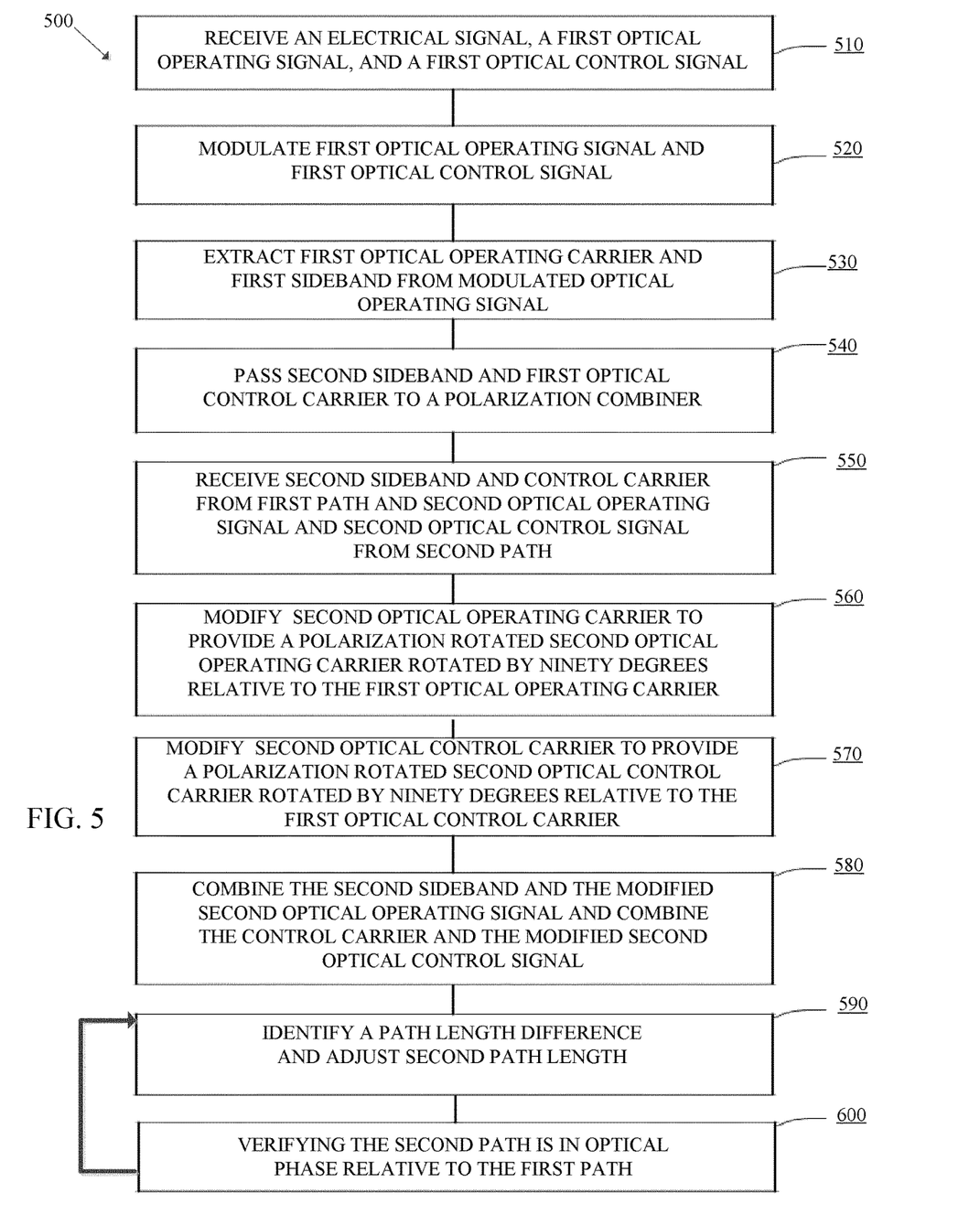
FIG. 5 is a flow chart of an exemplary embodiment of a method for creating an RF-modulated single sideband optical signal cross polarized with the optical carrier in the optical modulator system according to the inventive concepts disclosed herein.

Turning to FIG. 5, an exemplary embodiment of a method 500 according to the inventive concepts disclosed herein may include the following steps. The method 500 may be performed using various hardware, apparatuses, and systems disclosed herein, such as the aircraft control center 10, the optical modulator system 200, the optical modulator system 300, the optical modulator system 400, and/or components thereof. The method 500 may be used to implement a cross-polarization single sideband optical modulator system.

A step (510) may include receiving an electrical signal, a first optical operating signal, and a first optical control signal. The input may be received from an optical operating source and an optical control source, such as a laser light, broadband light, or other light source. The electrical signal may be an RF input.

A step (520) may include modulating the first optical operating signal and the first optical control signal. The modulation may be accomplished by a low biased, quadrature biased, or other modulator. The modulator can modulate the optical operating signal to provide an intensity-modulated optical operating signal and modulate the optical control signal to provide an intensity-modulated optical control signal. The intensity-modulated optical operating signal can include the first optical operating carrier ($v_s$), a lower sideband ($v_s - f_{RF}$), and an upper sideband ($v_s + f_{RF}$). The intensity-modulated optical control signal can include a first optical control carrier ($v_c$), a lower sideband ($v_c - f_{RF}$), and an upper sideband ($v_c + f_{RF}$). In a low biased modulator application, the amplitude-modulated signals of the optical operating signal do not include the first optical carrier ($v_s$), just a lower sideband ($v_s - f_{RF}$) and an upper sideband ($v_s + f_{RF}$).

A step (530) may include extracting the first optical operating carrier and the first sideband from the modulated optical operating signal, such as by filtering out the first optical operating carrier and the first sideband to provide the second sideband.

A step (540) may include passing, by the optical filter, the second sideband and the first optical control carrier to a polarization combiner.

A step (550) may include receiving the second sideband and the optical control carrier from a first path and a second optical carrier and a second optical control carrier from a second path. The second sideband and the optical control carrier from the first path may be received after being filtered by an optical filter. The optical filter filters the modulated optical operating signal and the modulated optical control signal to provide the upper sideband and first optical control carrier on the first path (e.g., first path 330 illustrated with respect to FIG. 3A).

A step (560) may include modifying the second optical operating carrier to provide a modified second optical operating carrier orthogonally polarized relative to (e.g., rotated ninety degrees relative to) the first optical operating carrier. A 90-degree cross splice can modify the received signals to provide orthogonal output signals. For example, the 90-degree cross splice can rotate the second optical operating carrier 90-degrees to provide a modified second optical operating carrier rotated ninety degrees relative to the optical operating signal (e.g., optical operating carrier of the optical operating signal). In some embodiments, the modified second optical operating carrier is a polarization rotated second optical operating carrier rotated ninety degrees relative to the first optical operating carrier. As will be appreciated, the signals do not have to be exactly 90 degrees. Sufficiently good performance could be obtained with signals that are not exactly at 90 degree, but 90 degrees is preferred.

A step (570) may include modifying the second optical control carrier to provide a modified second optical control carrier orthogonally polarized relative to (e.g., rotated ninety degrees relative to) the first optical control carrier. A 90-degree cross splice can modify the received signals to provide orthogonal output signals. For example, the 90-degree cross splice can rotate the second optical control carrier 90-degrees to provide a modified second optical control carrier rotated ninety degrees relative to the optical control signal. In some embodiments, the rotated second optical control carrier is a polarization rotated second optical control carrier rotated ninety degrees relative to the second optical control carrier. As will be appreciated, the signals do not have to be exactly 90 degrees. Sufficiently good performance could be obtained with signals that are not exactly at 90 degree, but 90 degrees is preferred.

A step (580) may include combining the second sideband and the rotated second optical operating signal to provide an electronic signal-modulated single sideband optical operating signal cross polarized with the modified second optical operating signal and combing a rotated second optical control signal and the first optical control carrier to provide a control carrier cross polarized with the second optical control signal. A polarization combiner may combine the first optical control carrier from the optical control signal along first path and the rotated second optical control carrier of the optical control signal along the second path. As an end result, the polarization combiner can provide an unmodulated control carrier cross polarized with the second optical control signal. The polarization combiner also combines the upper sideband from the optical operating signal along first path and the rotated optical operating signal of the optical operating signal along the second path. As an end result, the polarization combiner may provide an electronic signal-modulated single sideband optical operating signal cross polarized with the rotated second optical operating signal.

A step (590) may include identifying a path length difference and adjusting the second path length. While the electronic signal-modulated single sideband optical operating signal cross-polarized with the rotated second optical operating signal is the desired end result, due to the different paths taken and due to instability along those paths (e.g., temperature differences, fiber vibrations, fiber imperfections, environmental noise, etc.) that light is sensitive to, the signal-modulated single sideband optical operating signal may exhibit unstable phase relative to the rotated second optical operating signal. Accordingly, the unmodulated control carrier cross polarized with the second optical control signal is used to adjust the path lengths to have the second path be in optical phase relative to the first path. The photo diode may be configured to detect any changes in the unmodulated control carrier cross polarized with the second optical control signal, or in other words, the changes between the optical control signal along first path and the optical control carrier along the second path.

A controller receives the length difference signal from the photo diode and determines a path length adjustment for the length of the second path in order to adjust and stabilize the second path length with regard to the first path length such that the second path is in optical phase relative to the first path. The path length adjustment can be sent to the optical path controller that adjusts the length of the second path accordingly. The controller and/or optical path controller adjusts the optical path length using at least one of charging a piezoelectrical material that is attached to the second path length to change length of the second path length, altering an index of refraction within the second path length, altering an optical length through the second path length, or similar path adjustment techniques.

A step (600) may include verifying, by the photo diode, that second path is in optical phase relative to the first path. If any changes are noticed, the process of adjusting the path length (e.g., step 590) is implemented until the horizontal and vertical light are phase stable with respect each other. Once the second path is in optical phase relative to the first path, the resulting electronic signal-modulated single sideband optical operating signal cross polarized with the rotated second optical operating signal can be received by the output devices that can use the signal in communications and may adjust or manipulate the signal further.

As will be appreciated from the above, systems and methods for an optical modulator system or photonic processor system according to embodiments of the inventive concepts disclosed herein may improve cyber security and communications of aircraft and other platforms by that allows for a greater efficiency, easier use, a wide range of customization, and a wide variety of configurations compared to other signal structure systems. For example, the optical modulator system can be path and direction independent, providing customization and implementation into a wide variety of avionics systems. In some embodiments, the optical modulator system can provide passage of multiple optical carriers, polarization rotation, optical amplification, and polarization combining with coherence while avoiding the use of a multi-chip module design, which may be expensive or experience supply chain issues. The optical modulator system may provide modularity as each component can be individually optimized, repaired, or replaced to optimize the module performance. The optical modulator system may provide modulation efficiency as it is implementable with a wide range of modulators, including low biased, Mach-Zehnder, intensity, amplitude, and other modulators. The optical modulator system can suppress unwanted spectra (e.g., sidebands, harmonics, carrier, etc.) and similar environmental noise. As described in greater detail above, the optical modulator system can be configured in wide variety of implementations to provide a wide range of sideband and carrier suppression without a Vernier effect on the control laser. The optical modulator system can be configured to provide broadband operation with a scalability in excess of 100 GHz, while limiting optical loss.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried out in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A photonic processor, comprising:
a modulator configured to:
receive an electronic signal, a first optical control signal, and a first optical operating signal, the first optical operating signal received from an optical source circuit on a first path having a first length, the first optical control signal received from an optical control circuit on the first path having the first path length;
modulate the first optical operating signal using the electronic signal to provide an intensity-modulated optical operating signal comprising a first optical operating carrier, a first sideband, and a second sideband;
and
modulate the first optical control signal using the electronic signal to provide an intensity-modulated optical control signal comprising a first optical control carrier, a third sideband, and a fourth sideband;
an optical filter;
and
a polarization combiner;
the optical filter configured to:
extract the first optical operating carrier and the first sideband from the intensity-modulated optical operating signal; and
provide the second sideband and the first optical control carrier to the polarization combiner;
and
the polarization combiner configured to:
receive the second sideband and the first optical control carrier from the first path;
receive a second optical control carrier and a second optical operating carrier, the second optical operating carrier received from the optical source circuit on a second path having a second path length, the second optical control carrier received from the optical control circuit on the second path having the second path length;
modify the second optical operating carrier to provide a modified second optical operating carrier orthogonally polarized to the first optical operating carrier;
modify the second optical control carrier to provide a modified second optical control carrier orthogonally polarized to the first optical control carrier;
combine the second sideband and the modified second optical operating carrier to provide an electronic signal-modulated single sideband optical signal cross-polarized with the modified second optical operating carrier;
and
combine the first optical control carrier and the modified second optical control carrier to provide a control carrier cross-polarized with the second optical control carrier.

2. The photonic processor of claim 1, further comprising:
an optical path length adjuster positioned on the second path between the polarization combiner and the optical control circuit, the optical path length adjuster configured to:
receive a path length difference signal, the path length difference signal indicative of a difference in path length between the first path length and the second path length;
and
adjust the second path length in relation to the first path length, the adjustment stabilizing the second path length with the first path length such that the second path is in optical phase relative to the first path.

3. The photonic processor of claim 2, further comprising:
a polarizer that is configured to:
receive the control carrier cross-polarized with the second optical control carrier; and
adjust the first optical control carrier in the control carrier cross-polarized with the second optical control carrier to generate a forty-five-degree polarized modulated control carrier and a forty-five-degree polarized second optical control signal;
and
a photo diode configured to receive the forty-five-degree polarized modulated control carrier and provide the path length difference signal to the optical path length adjuster.

4. The photonic processor according to claim 1, wherein the optical filter comprises a first interleaver and a second interleaver, the first interleaver being vernierly-related to the second interleaver, the first interleaver configured to extract the first optical operating carrier from the intensity-modulated optical operating signal, and the second interleaver configured to extract the first sideband from the intensity-modulated optical operating signal and to extract the third sideband and fourth sideband from the intensity-modulated optical control signal.

5. The photonic processor according to claim 1, wherein the optical filter is further configured to extract the third sideband and the fourth sideband from the intensity-modulated optical control signal.

6. The photonic processor according to claim 1, wherein the first optical operating signal is a single mode laser signal and the modulator is a Mach-Zehnder modulator.

7. The photonic processor according to claim 1, wherein the electronic signal is an electronic radio frequency signal.

8. The photonic processor according to claim 7, wherein the first sideband is a lower sideband, the lower sideband comprising the first optical operating carrier offset by a difference of a frequency of the electronic radio frequency signal and the first optical operating carrier, and the second sideband is an upper sideband, the upper sideband comprising the first optical operating carrier offset by a summation of the frequency of the electronic radio frequency signal and the first optical operating carrier.

9. The photonic processor according to claim 1, wherein the polarization combiner includes a ninety-degree cross splice that is configured to modify the second optical operating carrier to provide the modified second optical operating carrier and to modify the second optical control carrier to provide the modified second optical control carrier.

10. A method, comprising:
receiving, by a modulator, an electronic signal, a first optical control signal, and a first optical operating signal, the first optical operating signal received from an optical source circuit on a first path having a first length, the first optical control signal received from an optical control circuit on the first path having the first path length;
modulating, by the modulator, the first optical operating signal using the electronic signal to provide an intensity-modulated optical operating signal comprising a first optical operating carrier, a first sideband, and a second sideband;
modulating, by the modulator, the first optical control signal using the electronic signal to provide an intensity-modulated optical control signal comprising a first optical control carrier, a third sideband, and a fourth sideband;
filtering, by an optical filter, the first optical operating carrier and the first sideband from the intensity-modulated optical operating signal and the third sideband and the fourth sideband from the intensity-modulated optical control signal;
passing, by the optical filter, the second sideband and the first optical control carrier to a polarization combiner;
receiving, by the polarization combiner, the second sideband and the first optical control carrier from the first path;
receiving, by the polarization combiner, a second optical control carrier and a second optical operating carrier, the second optical operating carrier received from the optical source circuit on a second path having a second path length, the second optical control carrier received from the optical control circuit on the second path having the second path length;
combining, by the polarization combiner, the second sideband and the second optical operating carrier to provide an electronic signal-modulated single sideband optical signal cross-polarized with the second optical operating carrier;
and
combining, by the polarization combiner, the first optical control carrier and the second optical control carrier to provide a control carrier cross-polarized with the second optical control carrier.

11. The method of claim 10, further comprising:
receiving, by an optical path length adjuster positioned on the second path between the polarization combiner and the optical control circuit, a path length difference signal, the path length difference signal indicative of a difference in path length between the first path length and the second path length; and
adjusting, by the optical path length adjuster, the second path length in relation to the first path length, the adjustment stabilizing the second path length with the first path length such that an optical phase of the second path is stable relative to the first path.

12. The method of claim 11, further comprising:
generating, by a forty-five-degree polarizer, a forty-five-degree polarized modulated control carrier and a forty-five-degree polarized second optical control carrier;
and
receiving, by a photo diode, the forty-five-degree polarized control carrier providing the path length difference signal to the optical path length adjuster.

13. The method of claim 11, wherein the electronic signal is an electronic radio frequency signal, and wherein the first sideband is a lower sideband, the lower sideband comprising the first optical operating carrier offset by a difference of a frequency of the electronic signal and the first optical operating carrier, and the second sideband is an upper sideband, the upper sideband comprising the first optical operating carrier offset by a summation of the frequency of the electronic signal and the first optical operating carrier.

14. A photonic processor, comprising:
a low biased amplitude modulator configured to:
receive an electronic signal, a first optical control signal, and a first optical operating signal, the first optical signal received from an optical source circuit on a first path having a first length, the first optical control signal received from an optical control circuit on the first path having the first path length;
modulate the first optical operating signal using the electronic signal to provide an amplitude-modulated optical operating signal comprising a first sideband and a second sideband; and
modulate the first optical control signal using the electronic signal to provide an amplitude-modulated control signal comprising a first optical control carrier, a third sideband, and a fourth sideband;
an optical filter; and
a polarization combiner;
the optical filter configured to:
extract the first sideband from the amplitude-modulated optical operating signal; and
provide the second sideband and the first optical control carrier;
and
the polarization combiner configured to:
receive the second sideband and first optical control carrier from the first path;
receive a second optical control carrier and a second optical operating carrier, the second optical operating carrier received from the optical source circuit on a second path having a second path length, the second optical control carrier received from the optical control circuit on the second path having the second path length;
combine the second sideband and the second optical operating carrier; and
combine the first optical control carrier and the second optical control carrier.

15. The photonic processor of claim 14, further comprising:
an optical path length adjuster positioned on the second path between the polarization combiner and the optical control circuit, the optical path length adjuster configured to:
receive a path length difference signal, the path length difference signal indicative of a difference in path length between the first path length and the second path length;
and
adjust the second path length in relation to the first path length, the adjustment stabilizing the second path length with the first path length such that an optical phase of the second path is stable relative to the first path.

16. The photonic processor of claim 15, further comprising:
a forty-five-degree polarizer that is configured to receive the control carrier cross polarized with the second optical control carrier and adjust the first optical control carrier in the control carrier cross polarized with the second optical control carrier to generate a forty-five-degree polarized modulated control carrier and a forty-five-degree polarized second optical control signal; and
a photo diode configured to receive the forty-five-degree polarized modulated control carrier and provide the path length difference signal to the optical path length adjuster.

17. The photonic processor according to claim 14, wherein the optical filter comprises a first interleaver and a second interleaver, the first interleaver being vernierly-related to the second interleaver, the first interleaver configured to extract to extract the first sideband from the amplitude-modulated optical operating signal and the second interleaver configured to extract the third sideband and fourth sideband from the amplitude-modulated optical control signal.

18. The photonic processor according to claim 14, wherein the optical filter is further configured to extract the third sideband and the fourth sideband from the amplitude-modulated optical control signal.

19. The photonic processor according to claim 14, wherein the polarization combiner includes a ninety-degree cross splice that is configured to modify the second optical operating carrier to provide a modified second optical operating carrier orthogonally polarized to the first optical operating carrier and to modify the second optical control carrier to provide a modified second optical control carrier orthogonally polarized to the first optical control carrier.

20. The photonic processor according to claim 14, wherein the electronic signal is an electronic radio frequency signal and wherein the first sideband is a lower sideband, the lower sideband comprising the first optical operating signal offset by a difference of a frequency of the electronic radio frequency signal and the first optical operating signal, and the second sideband is an upper sideband, the upper sideband comprising the first optical operating signal offset by a summation of the frequency of the electronic radio frequency signal and the first optical operating signal.

* * * * *